US011340277B2

(12) United States Patent
Yamamoto et al.

(10) Patent No.: US 11,340,277 B2
(45) Date of Patent: May 24, 2022

(54) ABNORMALITY DETERMINATION DEVICE FOR SECONDARY BATTERY

(71) Applicant: DENSO CORPORATION, Kariya (JP)

(72) Inventors: Nobuo Yamamoto, Kariya (JP); Ichiro Yamada, Kariya (JP); Shuhei Yoshida, Kariya (JP); Masaya Nakamura, Kariya (JP); Takehiko Yamaki, Kariya (JP); Hiroyasu Suzuki, Kariya (JP); Katsuki Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/992,578

(22) Filed: Aug. 13, 2020

(65) Prior Publication Data

US 2020/0371145 A1 Nov. 26, 2020

Related U.S. Application Data

(63) Continuation of application No. PCT/JP2019/001009, filed on Jan. 16, 2019.

(30) Foreign Application Priority Data

Feb. 14, 2018 (JP) .............................. JP2018-024388

(51) Int. Cl.
*G01R 27/26* (2006.01)
*G01R 31/389* (2019.01)
*G01R 31/388* (2019.01)

(52) U.S. Cl.
CPC ....... *G01R 27/2605* (2013.01); *G01R 31/388* (2019.01); *G01R 31/389* (2019.01)

(58) Field of Classification Search
CPC .............. G01R 27/2605; G01R 31/389; G01R 31/388; G01R 31/392; G01R 31/36;
(Continued)

(56) References Cited

U.S. PATENT DOCUMENTS

2006/0238168 A1 10/2006 Matsuo et al.
2010/0247988 A1 9/2010 Okumura et al.
(Continued)

FOREIGN PATENT DOCUMENTS

JP 2002-42895 A 2/2002
JP 2003-092805 A 3/2003
(Continued)

OTHER PUBLICATIONS

Mar. 26, 2019 Search Report issued in International Patent Application PCT/JP2019/001009.

*Primary Examiner* — Farhana A Hoque
(74) *Attorney, Agent, or Firm* — Oliff PLC

(57) ABSTRACT

An abnormality determination device for a secondary battery includes an internal-resistance calculation unit, a threshold memory unit, a capacity balance comparison unit, and an abnormality determination unit. The internal-resistance calculation unit detects an internal resistance in a negative-electrode reaction resistance dominant region in which a reaction resistance of a negative electrode is dominant in a charge and discharge reaction of the secondary battery. The threshold memory unit stores a capacity balance threshold used as a reference for determining abnormality in a balance between a capacity of a positive electrode and a capacity of the negative electrode in the secondary battery. The capacity balance comparison unit compares the internal resistance calculated by the internal-resistance calculation unit with the capacity balance threshold stored in the threshold memory unit. The abnormality determination unit determines abnormality in capacity balance in the secondary battery based on a comparison result from the capacity balance comparison unit.

7 Claims, 11 Drawing Sheets

(58) Field of Classification Search
CPC ....... Y02E 60/10; H01M 10/44; H01M 10/42; H01M 10/48; H02J 7/00
USPC .......................................................... 324/658
See application file for complete search history.

(56) References Cited

U.S. PATENT DOCUMENTS

2014/0218042 A1* 8/2014 Koba .................. G01R 31/392
324/430
2016/0240898 A1 8/2016 Koba et al.

FOREIGN PATENT DOCUMENTS

| JP | 2008-041565 A | 2/2008 |
| JP | 2018-014210 A | 1/2018 |

* cited by examiner

ABNORMALITY DETERMINATION DEVICE FOR SECONDARY BATTERY

CROSS-REFERENCE TO RELATED APPLICATION

This application is the U.S. bypass application of International Application No. PCT/JP2019/001009 filed on Jan. 16, 2019 which designated the U.S. and claims priority to Japanese Patent Application No. 2018-24388, filed on Feb. 14, 2018, the contents of both of which are incorporated herein by reference.

TECHNICAL FIELD

The present disclosure relates to an abnormality determination device for a secondary battery.

BACKGROUND

Conventionally, there has been a demand to accurately determine abnormality of a secondary battery. For example, Japanese Patent No. 5873113 discloses a device for determining abnormality of a nickel-metal hydride battery which detects gradients of straight lines or approximate straight lines for two or more complex impedances with different frequencies, and determines abnormality of the secondary battery based on the inclinations.

SUMMARY

An aspect of the present disclosure is an abnormality determination device for a secondary battery, the abnormality determination device including:

an internal-resistance calculation unit configured to calculate an internal resistance in a negative-electrode reaction resistance dominant region in which a reaction resistance of a negative electrode is dominant in a charge and discharge reaction of the secondary battery, a threshold memory unit that stores a capacity balance threshold used as a reference for determining whether a balance between a capacity of a positive electrode and a capacity of the negative electrode in the secondary battery is abnormal, a capacity balance comparison unit configured to compare the internal resistance detected by the internal-resistance calculation unit with the capacity balance threshold stored in the threshold memory unit, and an abnormality determination unit configured to determine abnormality in capacity balance in the secondary battery based on a comparison result from the capacity balance comparison unit.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
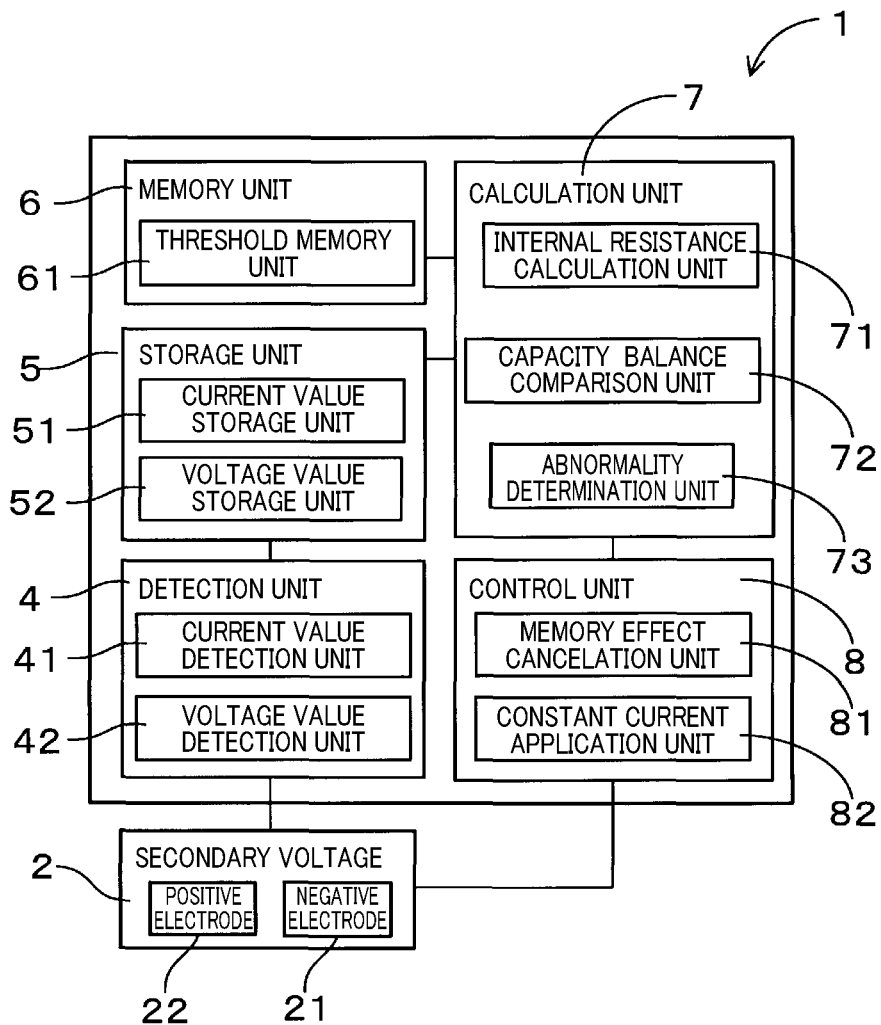
FIG. 1 is a block diagram illustrating a configuration of an abnormality determination device for a secondary battery according to a first embodiment.

The device disclosed in Japanese Patent No. 5873113 has problems that a special device for detecting the complex impedances of the secondary battery is needed, leading to increased costs, and a relatively long time for detection of the complex impedances is needed. Thus, the device has room for improvement in inexpensively implementing accurate abnormality determination in a short time using a simple configuration.

An object of the present disclosure is to provide an abnormality determination device for a secondary battery, the abnormality determination device being capable of inexpensively determining abnormality in a short time using a simple configuration.

An aspect of the present disclosure is an abnormality determination device for a secondary battery, the abnormality determination device includes an internal-resistance calculation unit configured to calculate an internal resistance in a negative-electrode reaction resistance dominant region in which a reaction resistance of a negative electrode is dominant in a charge and discharge reaction of the secondary battery, a threshold memory unit that stores a capacity balance threshold used as a reference for determining whether a balance between a capacity of a positive electrode and a capacity of the negative electrode in the secondary battery is abnormal, a capacity balance comparison unit configured to compare the internal resistance detected by the internal-resistance calculation unit with the capacity balance threshold stored in the threshold memory unit, and an abnormality determination unit configured to determine abnormality in capacity balance in the secondary battery based on a comparison result from the capacity balance comparison unit.

A main cause of abnormality in capacity balance in a secondary battery is a loss of dischargeable reserve capacity provided in a negative electrode active substance. The loss of the reserve capacity changes the internal resistance in the negative-electrode reaction resistance dominant region. In the abnormality determination device for the secondary battery, the capacity balance comparison unit compares the internal resistance in the negative-electrode reaction resistance dominant region calculated by the internal-resistance calculation unit with the capacity balance threshold stored in the threshold memory unit, and the abnormality determination unit determines abnormality in capacity balance in the secondary battery based on the comparison result from the capacity balance comparison unit. Accordingly, the abnormality determination device can detect the internal resistance in the negative-electrode reaction resistance dominant region to determine abnormality in capacity balance. This enables abnormality determination to be more accurately achieved in a shorter time than detection of complex impedances. The abnormality determination device does not require expensive components for detecting complex impedances and can have a relatively simple configuration, enabling a reduction in costs.

As described above, the present disclosure can provide an abnormality determination device for a secondary battery, the abnormality determination device being capable of inexpensively determining abnormality in a short time using a simple configuration.

First Embodiment

An embodiment of the above-described abnormality determination device for the secondary battery will be described using FIGS. 1 to 5.

An abnormality determination device 1 according to the present embodiment is an abnormality determination device 1 for a secondary battery 2 and includes an internal-resistance calculation unit 71, a threshold memory unit 61, a capacity balance comparison unit 72, and an abnormality determination unit 73.

The internal-resistance calculation unit 71 detects an internal resistance R in a negative-electrode reaction resistance dominant region in which a reaction resistance of a negative electrode 21 is dominant in a charge and discharge reaction of the secondary battery 2.

The threshold memory unit 61 stores a capacity balance threshold used as a reference value for determining abnormality in balance between the capacity of a positive electrode 22 and the capacity of the negative electrode 21 in the secondary battery 2.

The capacity balance comparison unit 72 compares the internal resistance R calculated by the internal-resistance calculation unit 71 with the capacity balance threshold stored in the threshold memory unit 61.

The abnormality determination unit 73 determines abnormality in capacity balance in the secondary battery 2 based on a comparison result from the capacity balance comparison unit 72.

The abnormality determination device 1 will be described below in detail.

The secondary battery 2 illustrated in FIG. 1 is a nickel-metal hydride battery. In the present embodiment, the secondary battery 2 includes the negative electrode 21 and the positive electrode 22 provided in a battery case to form a battery cell, the negative electrode 21 including a hydrogen storage alloy and the positive electrode 22 including nickel oxyhydroxide (NiO(OH)).

As illustrated in FIG. 1, the abnormality determination device 1 includes a detection unit 4, a storage unit 5, a memory unit 6, a calculation unit 7, and a control unit 8.

The detection unit 4 is connected to the secondary battery 2. As illustrated in FIG. 1, the detection unit 4 includes a current value detection unit 41 and a voltage value detection unit 42. The current value detection unit 41 includes a predetermined ammeter to acquire the value of a current applied to the secondary battery 2. The voltage value detection unit 42 includes a predetermined voltmeter to detect the value of a voltage applied to the secondary battery 2.

The storage unit 5 illustrated in FIG. 1 includes a rewritable, nonvolatile memory and includes a current value storage unit 51 and a voltage value storage unit 52. The current value storage unit 51 stores the current value detected by the current value detection unit 41, and the voltage value storage unit 52 stores the voltage value detected by the voltage value detection unit 42.

Figure 2A:
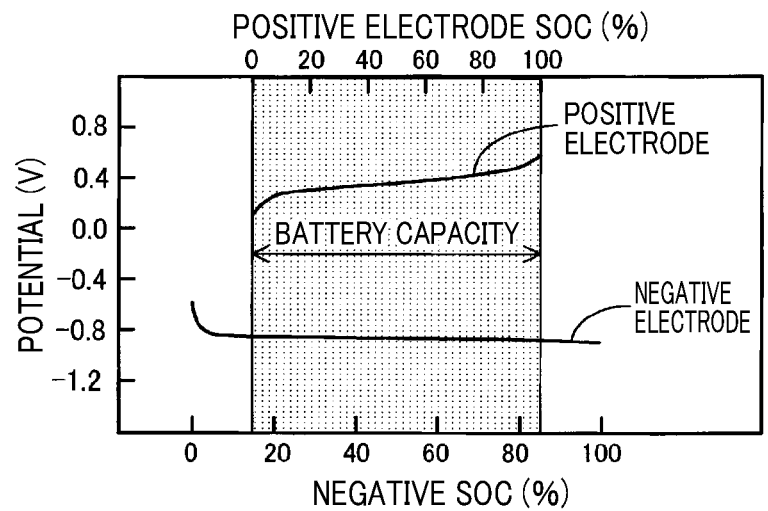
FIG. 2A is a conceptual drawing illustrating that a capacity balance is normal according to the first embodiment.
Figure 2B:
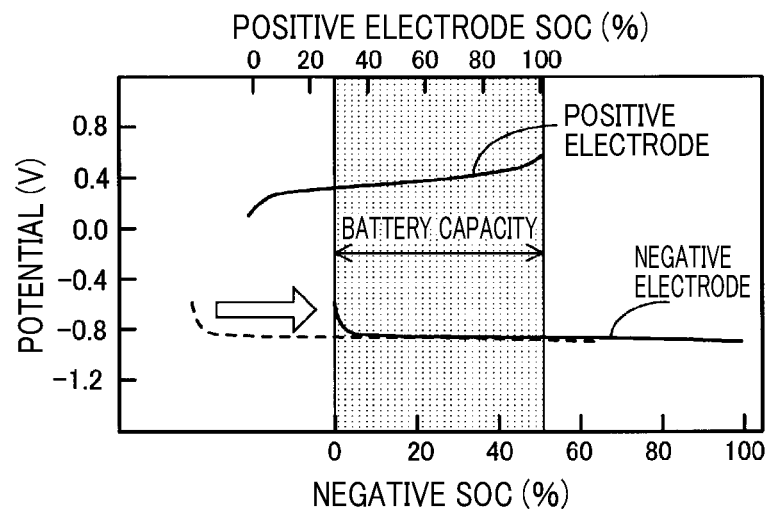
FIG. 2B is a conceptual drawing illustrating that the capacity balance is abnormal according to the first embodiment.

The memory unit 6 illustrated in FIG. 1 includes a nonvolatile memory and includes a threshold memory unit 61. The threshold memory unit 61 stores a capacity balance threshold used as a reference for determining whether the balance between the capacity of the positive electrode and the capacity of the negative electrode of the secondary battery is abnormal. As illustrated in FIG. 2A, the battery capacity of the secondary battery 2 can be represented as a region where a positive electrode SOC corresponding to the capacity of the positive electrode overlaps a negative electrode SOC corresponding to the capacity of the negative electrode. As illustrated in FIG. 2B, when a loss of a dischargeable reserve capacity provided in a negative electrode active substance in the negative electrode 21 causes the negative electrode SOC to deviate with respect to the positive electrode SOC, reducing the range within which the negative electrode SOC overlaps the positive electrode SOC. The battery capacity decreases when abnormality in capacity balance occurs, which corresponds to a relative deviation between the positive electrode SOC and the negative electrode SOC. In the nickel-metal hydride battery, hydrogen escape may occur in which hydrogen occluded in the negative electrode active substance in the negative electrode 21 is emitted to the outside of the battery case and lost from a reaction system. Then, the dischargeable reserve capacity provided in the negative electrode active substance may be lost and cause the negative electrode SOC to deviate as illustrated in FIG. 2B, leading to abnormality in capacity balance.

The capacity balance threshold stored in the threshold memory unit 61 can be determined as appropriate according to the configuration of the negative electrode 21, and in the present embodiment, information representing the resistance of the negative electrode 21, used as the reference, is set. Note that the capacity balance threshold is not limited to a particular form but can be in the form of a mathematical formula, a map, a graph, a table, or the like. The capacity balance threshold can be created based on measured values obtained by conducting an accelerated deterioration test on the secondary battery 2 for measurement, which is then disassembled for investigation, or can be created by a mathematical formula that logically derives a change in capacity of the negative electrode using a model of the secondary battery 2. Note that the threshold memory unit 61 may store a plurality of capacity balance thresholds.

Figure 3:
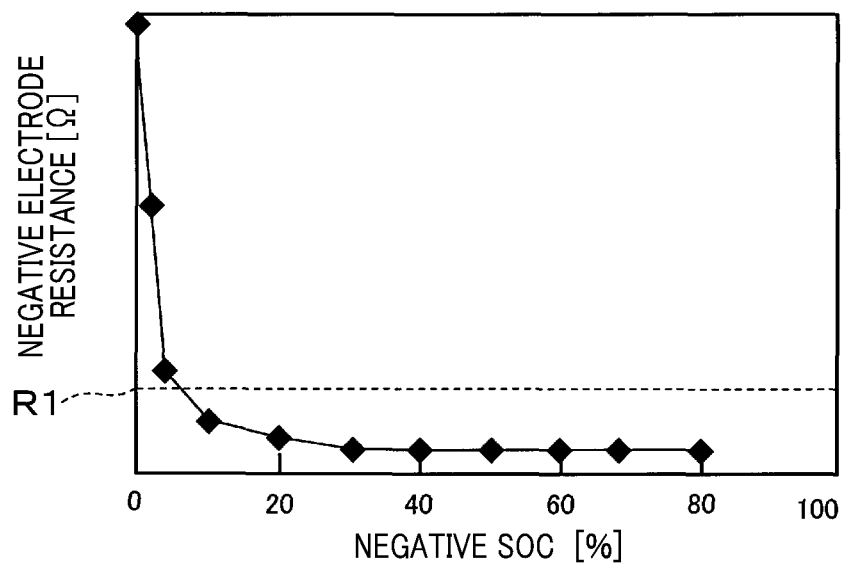
FIG. 3 is a conceptual drawing illustrating a relationship between a negative electrode SOC and a negative electrode resistance according to the first embodiment.
Figure 4:
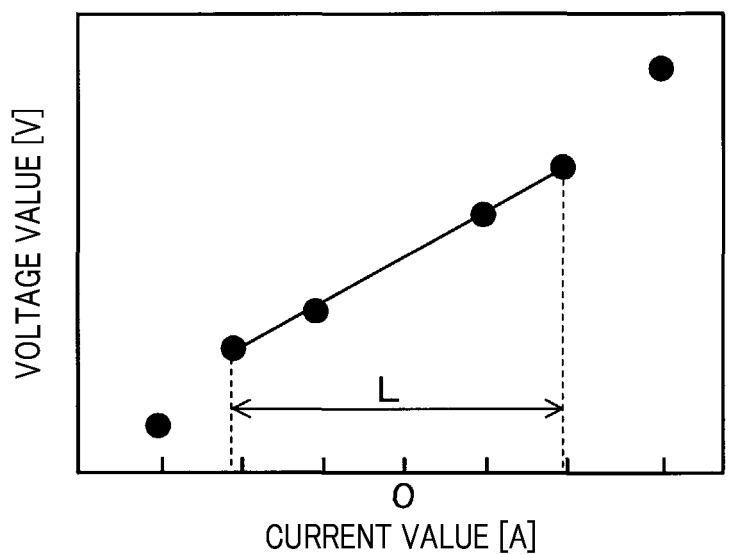
FIG. 4 is a conceptual drawing illustrating a relationship between applied current and applied voltage according to the first embodiment.

In the present embodiment, as illustrated in FIG. 3, an internal resistance R1 used as a capacity balance threshold is set as a predetermined resistance value in a graph indicating a correspondence relationship between the negative electrode SOC and the resistance of the negative electrode 21, which are obtained by conducting the accelerated deterioration test on the secondary battery 2 for measurement, which is then disassembled for investigation.

The calculation unit 7 includes a predetermined calculation apparatus, and includes the internal-resistance calculation unit 71, the capacity balance comparison unit 72, and the abnormality determination unit 73. The internal-resistance calculation unit 71 calculates the internal resistance R of the secondary battery 2 based on the current value detected by the current value detection unit 41 and the voltage value detected by the voltage value detection unit 42.

The internal resistance, which corresponds to a factor reducing the battery voltage of the secondary battery 2, is determined by a relationship between three resistance components of resistance including an electron resistance, a reaction resistance, and an internal mass transfer resistance. The secondary battery 2 can be considered as a series equivalent circuit of the three resistance components. In general, the electron resistance is a resistance component mainly generated in a time domain immediately after application of a constant current to the battery. Additionally, the reaction resistance is a resistance component mainly generated in a time domain after the time domain where the electron resistance is generated. Further, the internal mass transfer resistance is generated when a constant current is applied for a long time, and is mainly generated in a time domain after the time domain of the reaction resistance. A negative-electrode reaction resistance dominant region is a time domain where, among the above-described three resistance components, the reaction resistance of the negative electrode 21 accounts for the highest percentage of a discharge period. In the negative-electrode reaction resistance dominant region, the reaction resistance of the negative electrode 21 dominantly determines the internal resistance of the secondary battery 2, and thus the internal resistance of the secondary battery 2 can be considered as the resistance of the negative electrode 21. In the present embodiment, the internal-resistance calculation unit 71 is configured to calculate the internal resistance from a voltage response resulting from application of a pulse current to the secondary battery 2.

The capacity balance comparison unit 72 illustrated in FIG. 1 compares the internal resistance R calculated by the internal-resistance calculation unit 71 with the capacity balance threshold R1 stored in the threshold memory unit 61. The abnormality determination unit 73 determines abnormality in capacity balance in the secondary battery 2 based on a comparison result from the capacity balance comparison unit 72. In the present embodiment, the abnormality determination unit 73 determines the capacity balance to be abnormal when the comparison result from the capacity balance comparison unit 72 indicates that the internal resistance R calculated by the internal-resistance calculation unit 71 is larger than the capacity balance threshold R1 stored in the threshold memory unit 61.

Figure 2C:
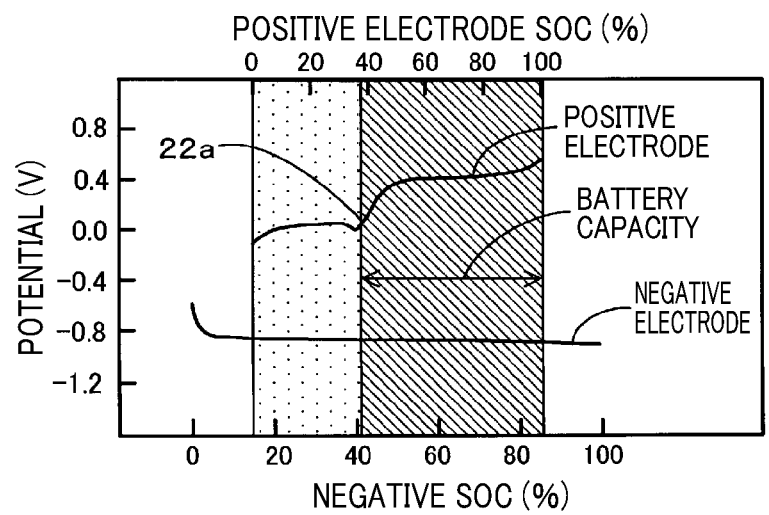
FIG. 2C is a conceptual drawing illustrating that a memory effect has occurred according to the first embodiment.

Replenishing charge of the secondary battery 2 such as a nickel-metal hydride battery may lead to production of a memory effect in which a temporary voltage drop occurs during discharge. As illustrated in FIG. 2C, the memory effect produced in the secondary battery 2 leads to formation, at an intermediate position of the positive electrode SOC of the positive electrode 22, of a potential decrease portion 22a with a rapid decrease in potential. As a result, depending on the degree of decrease in potential in the potential decrease portion 22a or a voltage required by equipment to which the secondary battery 2 is connected, a positive electrode SOC region equal to or lower than the potential decrease portion 22a of the positive electrode 22 may be unavailable, and the lower limit of the battery capacity may be determined by the potential decrease portion 22a of the positive electrode 22. In this case, an apparent battery capacity decreases, but the decrease differs from a decrease in battery capacity based on abnormality in capacity balance caused by deviation of the negative electrode SOC of the negative electrode 21.

Thus, for more accurate determination of abnormality in capacity balance, the present embodiment includes a memory effect cancellation unit 81 provided in the control unit 8 illustrated in FIG. 1. The memory effect cancellation unit 81 is configured to discharge the secondary battery 2 until the battery voltage decreases to a predetermined value or smaller, thus allowing the memory effect to be canceled. In the present embodiment, the memory effect cancellation unit 81 cancels the memory effect by discharging the secondary battery 2 until the battery capacity is equal to or lower than 1.0 V. The cancellation of the memory effect by the memory effect cancellation unit 81 can precede the detection of the current value and the voltage value for the computation of the internal resistance R by the internal-resistance calculation unit 71.

The control unit 8 illustrated in FIG. 1 includes a constant current application unit 82. The constant current application unit 82 applies a constant current to the secondary battery 2 to charge and discharge the secondary battery 2. In the present embodiment, the constant current application unit 82 is configured to apply a pulse current to the secondary battery 2 to charge and discharge the secondary battery 2. The value of the current applied by the constant current application unit 82 can be set as appropriate, and is preferably within a range L in which an I-V plot indicating a relationship between the applied current and the applied voltage illustrated in FIG. 4 has linearity. Additionally, an application time for the constant current can be set equal to a time required to reach a time domain where the reaction resistance of the negative electrode 21 is dominant, and can range from 0.01 to 100 sec. and more preferably from 0.1 to 10 sec. in order to achieve an appropriate estimation accuracy.

Figure 5:
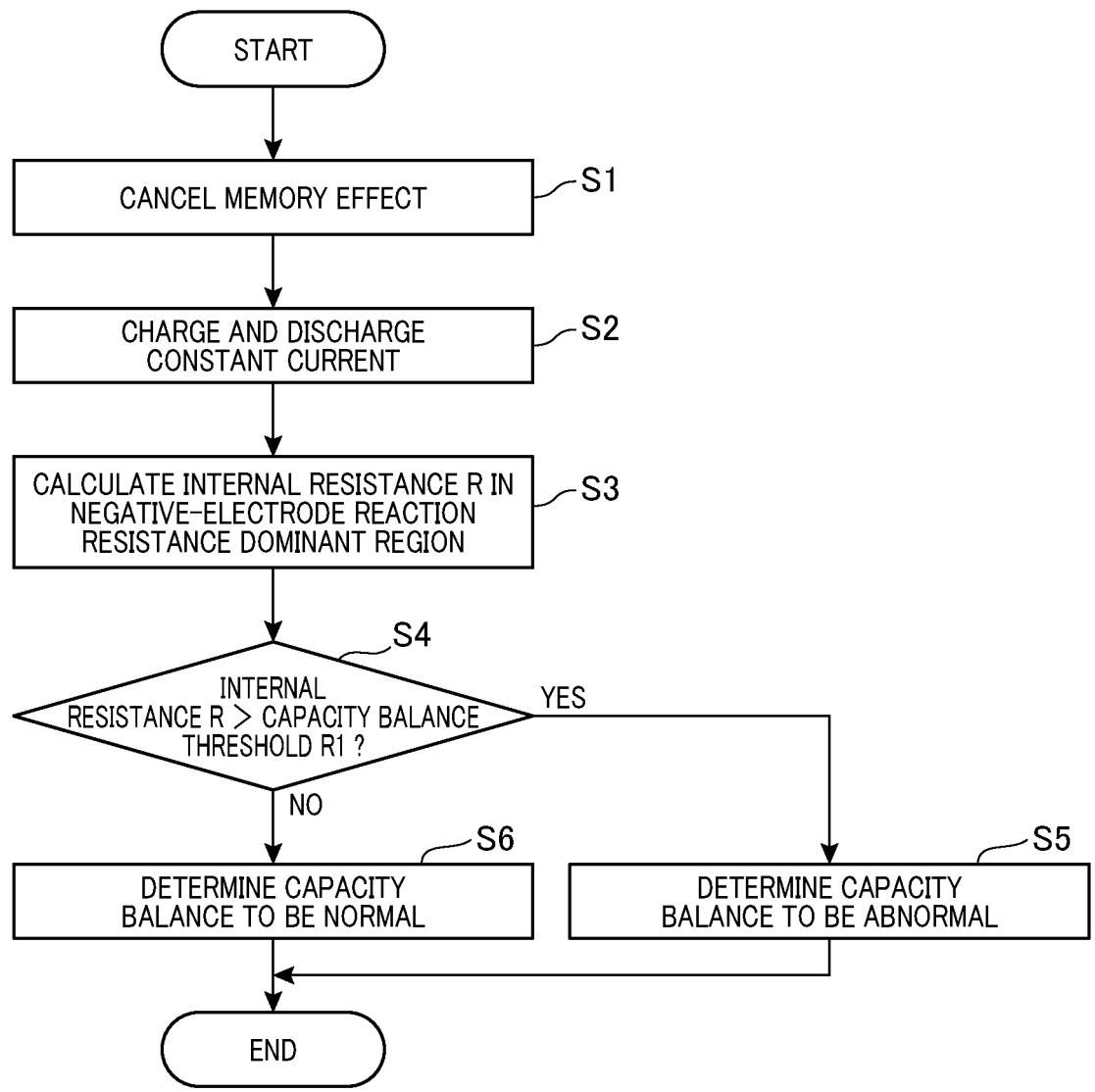
FIG. 5 is a flow chart illustrating a process of estimating abnormality of the secondary battery according to the first embodiment.

Next, usage of the abnormality determination unit 1 will be described using a flow chart illustrated in FIG. 5. First, as illustrated in FIG. 5, in step S1, the memory effect cancellation unit 81 cancels the memory effect in the secondary battery 2. In the present embodiment, the secondary battery is discharged until the battery voltage of the secondary battery 2 detected by the voltage value detection unit 42 and stored in the voltage value storage unit 52 is equal to or lower than 1.0 V. Subsequently, in step S2 illustrated in FIG. 5, the constant current application unit 82 applies a constant current to the secondary battery 2 to charge and discharge the secondary battery 2.

Subsequently, in step S3 illustrated in FIG. 5, the internal resistance R in the negative-electrode reaction resistance dominant region of the secondary battery 2 is calculated. In step S3, first, the current value detection unit 41 detects and stores the current value of the secondary battery 2 in the current value storage unit 51, and the voltage value detection unit 42 detects and stores the voltage value of the secondary battery 2 in the voltage value storage unit 52. The internal-resistance calculation unit 71 calculates the internal resistance R from the current value stored in the current value storage unit 51 and the voltage value stored in the voltage value storage unit 52. The internal resistance R calculated by the internal-resistance calculation unit 71 is stored in a resistance value storage unit not illustrated.

Then, in step S4 illustrated in FIG. 5, the capacity balance comparison unit 72 compares the internal resistance R of the secondary battery 2 with the capacity balance threshold R1. The capacity balance threshold R1 is extracted from the threshold memory unit 61. In a case where the comparison result from the capacity balance comparison unit 72 indicates that the internal resistance R is larger than the capacity balance threshold R1, the process proceeds to Yes in step S4, and in step S5, the abnormality determination unit 73 determines the capacity balance of the secondary battery 2 to be abnormal, and the process is terminated.

On the other hand, in a case where the comparison result from the capacity balance comparison unit 72 indicates that the internal resistance R is not larger than the capacity balance threshold R1, the process proceeds to No in step S4. In step S6, the abnormality determination unit 73 determines the capacity balance in the secondary battery 2 to be normal, and the process is terminated.

Now, functions and effects of the abnormality determination device 1 for the secondary battery according to the present embodiment will be described.

According to the abnormality determination device 1, the capacity balance comparison unit 72 compares the internal resistance R in the negative-electrode reaction resistance dominant region calculated by the internal-resistance calculation unit 71 with the capacity balance threshold R1 stored in the threshold memory unit 61, and based on the comparison result, the abnormality determination unit 73 determines abnormality in capacity balance in the secondary battery 2. Accordingly, the abnormality determination device 1 determines abnormality in capacity balance based on the internal resistance R in the negative-electrode reaction resistance dominant region and thus enables abnormality in capacity balance to be determined in a shorter time than based on detection of complex impedances. The abnormality determination device 1 does not require expensive components for detecting complex impedances and can be relatively simply configured, enabling a reduction in costs.

Further, in the present embodiment, the abnormality determination unit 73 determines the capacity balance to be abnormal when the comparison result from the capacity balance comparison unit 72 indicates that the internal resistance R calculated by the internal-resistance calculation unit 71 is larger than the capacity balance threshold R1 stored in the threshold memory unit 61. This allows abnormality in capacity balance to be accurately determined in a shorter time based on the internal resistance R in the negative-electrode reaction resistance dominant region.

Furthermore, the present embodiment includes the constant current application unit 82 applying a pulse current to the secondary battery 2 to charge and discharge the secondary battery 2, the current value detection unit 41 detecting the current value of the secondary battery 2, and the voltage value detection unit 42 detecting the voltage value of the secondary battery 2, and the internal-resistance calculation unit 71 calculates the internal resistance R in the negative-electrode reaction resistance dominant region based on the current value detected by the current value detection unit 41 and the voltage value detected by the voltage value detection unit 42. This allows abnormality to be accurately determined in a much shorter time than based on detection of complex impedances.

Additionally, in the present embodiment, the memory effect cancellation unit 81 cancels the memory effect in the secondary battery 2 before determining abnormality in capacity balance. This allows the memory effect to be eliminated from the secondary battery 2 before determination of abnormality in capacity balance, allowing the abnormality to be more accurately determined.

Note that, in the present embodiment, although the memory effect cancellation unit 81 cancels the memory effect in the secondary battery 2 before determination of abnormality in capacity balance, alternatively, the memory effect cancellation unit 81 may be omitted to avoid cancellation of the memory effect in the secondary battery 2.

As described above, according to the present embodiment, the abnormality determination device 1 for the secondary battery can be provided that has a simple configuration and that can inexpensively determine abnormality in a short time.

Second Embodiment

Figure 6:
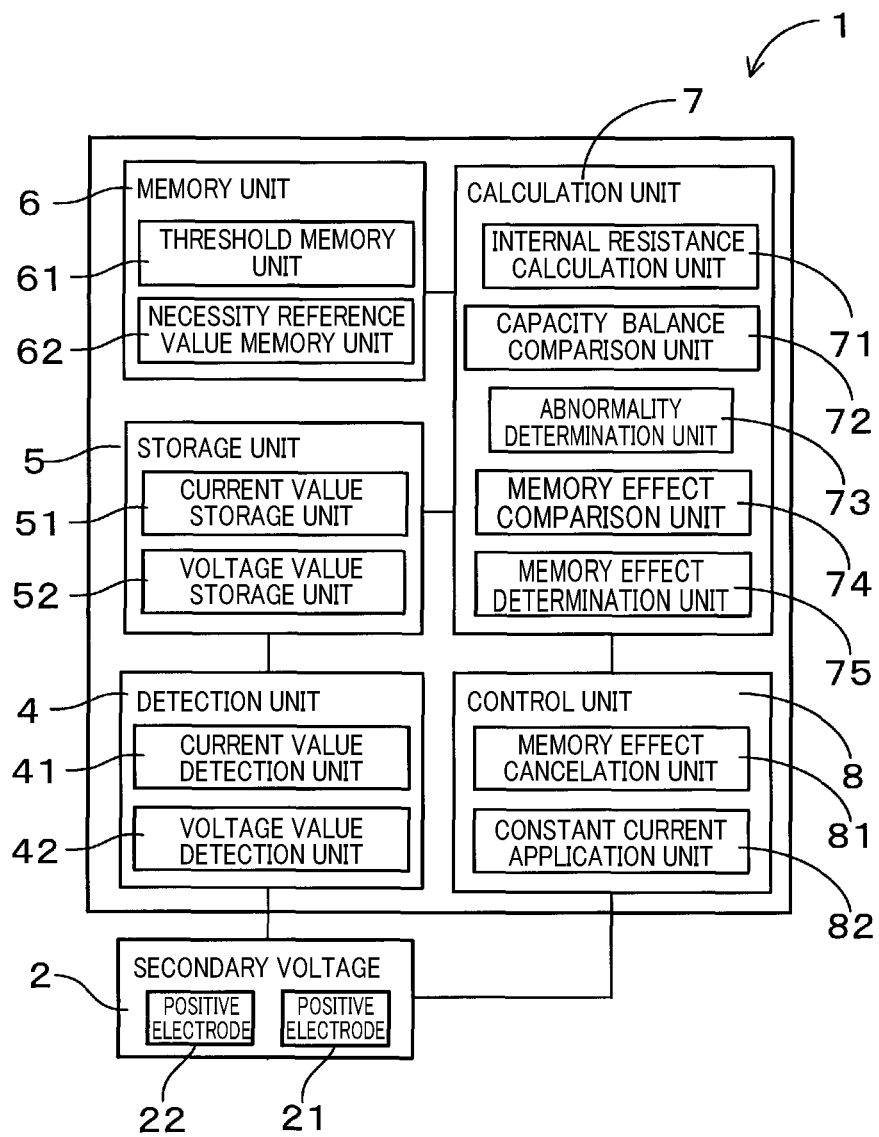
FIG. 6 is a block diagram illustrating a configuration of an abnormality determination device for a secondary battery according to a second embodiment.

An abnormality determination device 1 for the secondary battery according to the present embodiment includes, in addition to the components of the first embodiment illustrated in FIG. 1, a necessity reference value memory unit 62 provided in the memory unit 6 and a memory effect comparison unit 74 and a memory effect determination unit 75 provided in the calculation unit 7 as illustrated in FIG. 6. The other components of the present embodiment are equivalent to those of the first embodiment, and are denoted by the same reference signs in the first embodiment and will not be described below.

The necessity reference value memory unit 62 illustrated in FIG. 1 stores a necessity reference value used as a reference for determining whether to cancel the memory effect in the secondary battery 2. In the present embodiment, the necessity reference value is information representing the resistance of the negative electrode 21 used as the reference. Note that the necessity reference value is not limited to a particular form but can be in the form of a mathematical formula, a map, a table, or the like. The necessity reference value memory can be created based on measured values obtained by conducting an accelerated deterioration test on the secondary battery 2 for measurement, which is then disassembled for investigation, or can be created by a mathematical formula that logically derives production of the memory effect using a model of the secondary battery 2. Note that the necessity reference value memory unit 62 may memorize a plurality of necessity reference values.

The memory effect comparison unit 74 illustrated in FIG. 1 compares the internal resistance R calculated by the internal-resistance calculation unit 71 with a necessity reference value R2 stored in the necessity reference value memory unit 62. The memory effect determination unit 75 determines whether to cancel the memory effect in the secondary battery 2 based on a comparison result from the memory effect comparison unit 74.

Figure 7A:
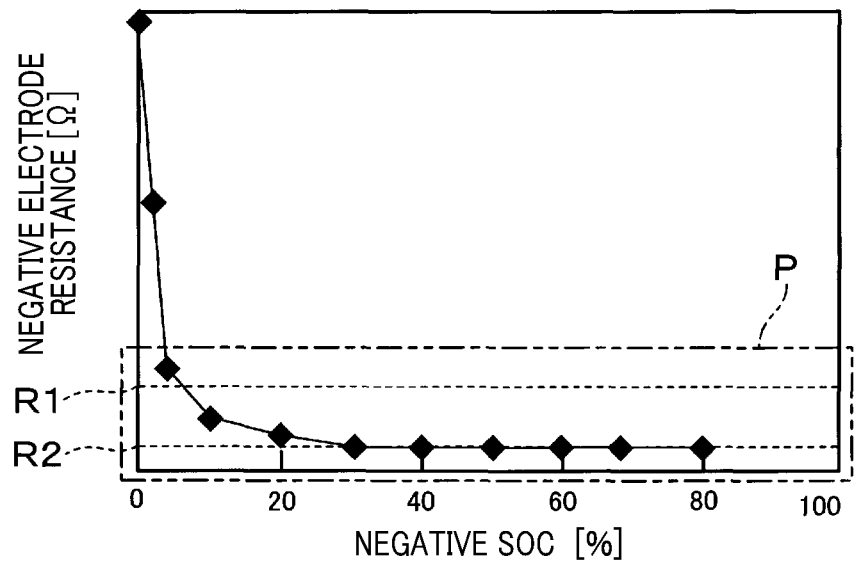
FIG. 7A is a conceptual drawing illustrating a relationship between the negative electrode SOC and the negative electrode resistance according to the second embodiment.
Figure 7B:
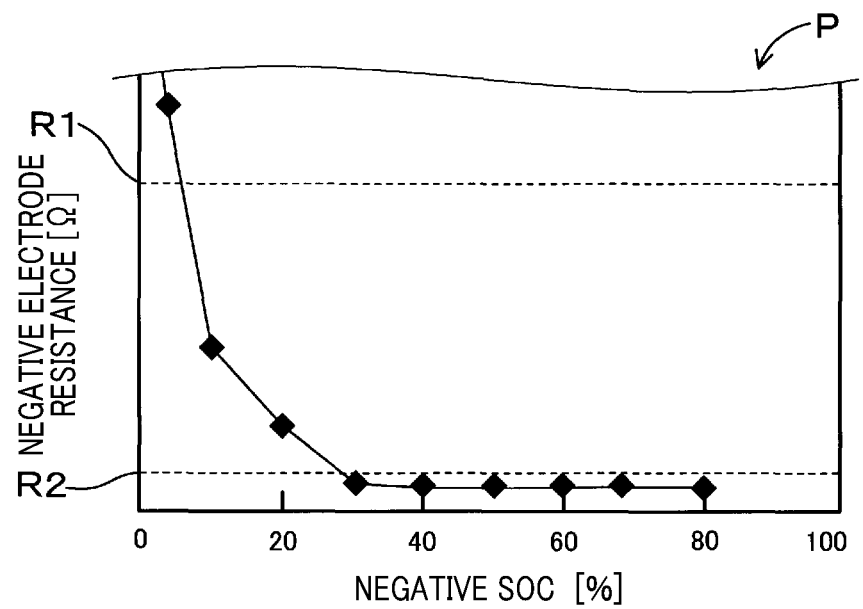
FIG. 7B is a partially enlarged view P of FIG. 7A.

In the present embodiment, the memory effect determination unit 75 determines that the memory effect in the secondary battery 2 needs to be cancelled when the comparison result from the memory effect comparison unit 74 indicates that the internal resistance R calculated by the internal-resistance calculation unit 71 is smaller than the necessity reference value R2 stored in the necessity reference value memory unit 62. As illustrated in FIG. 2C, in a case where the memory is present, the negative electrode SOC exhibits a relatively high value even in a low SOC region of the secondary battery 2. As illustrated in FIG. 7A and FIG. 7B, which corresponds to an enlarged view of a region P in FIG. 7A, with the negative electrode SOC having a relatively large value, the negative electrode resistance has a relatively small value. Thus, in a case where the internal resistance R calculated by the internal-resistance calculation unit 71 is smaller than the necessity reference value R2, the negative electrode SOC is relatively high, allowing for a determination that the memory is present. Note that, as illustrated in FIG. 7A and FIG. 7B, the necessity reference value R2 is smaller than the capacity balance threshold R1.

In the present embodiment, the memory effect cancellation unit 81 cancels the memory effect before the detection of the internal resistance R by the internal-resistance calculation unit 71 and also cancels the memory effect based on a determination result from the memory effect determination unit 75. Note that, after the memory effect cancellation unit 81 cancels the memory effect, the memory effect determination unit 75 may determine again whether to cancel the memory effect in the secondary battery 2.

Figure 8:
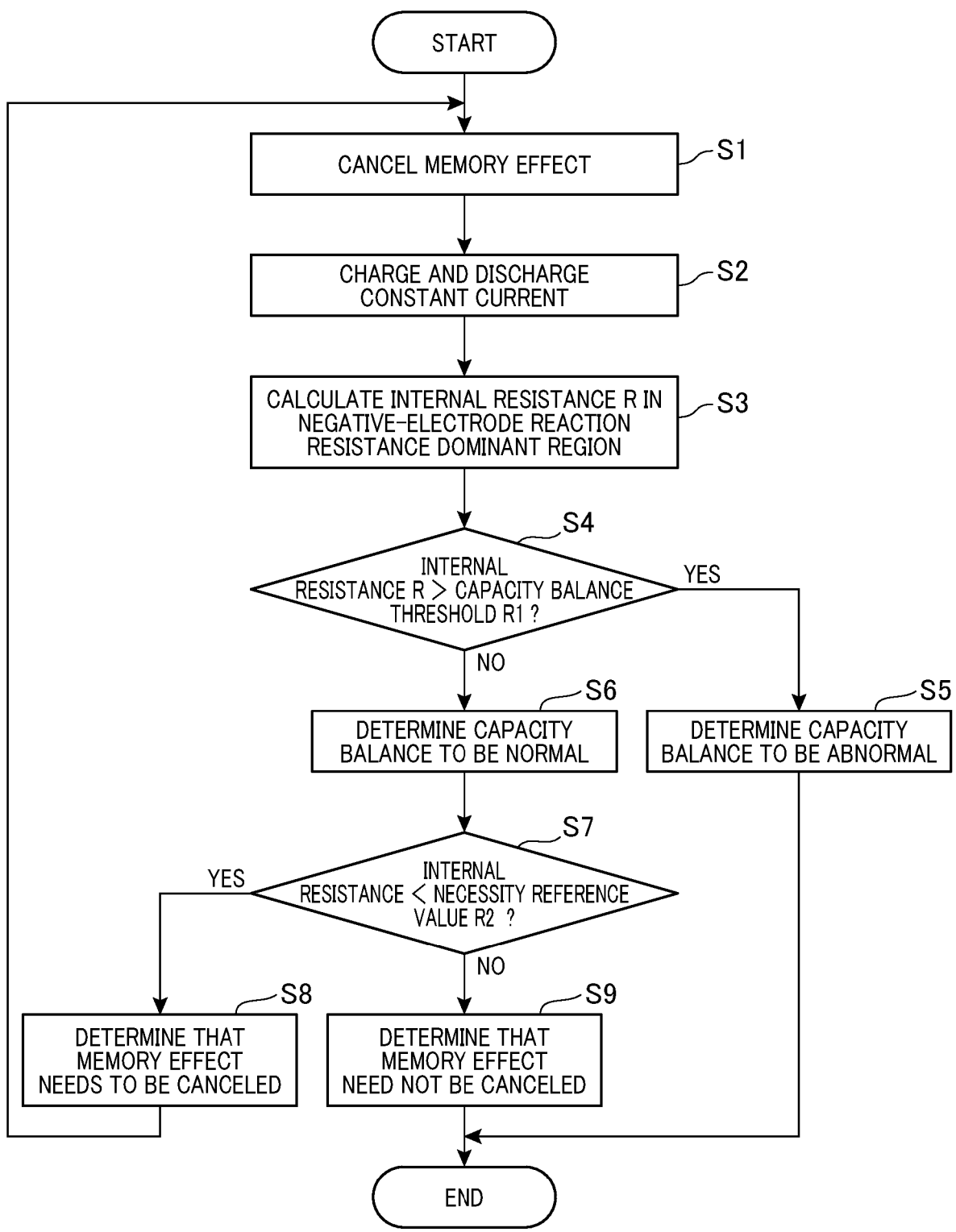
FIG. 8 is a flow chart illustrating a process of estimating abnormality of the secondary battery according to the second embodiment.

Usage of the abnormality determination device 1 according to the present embodiment will be described using a flow chart illustrated in FIG. 8. First, as in the case with the first embodiment illustrated in FIG. 5, steps S1 to S6 are executed. Then, after the capacity balance is determined to be normal in step S6, the process proceeds to step S7 illustrated in FIG. 8, and the memory effect comparison unit 74 compares the internal resistance R with the necessity reference value R2 stored in the necessity reference value memory unit 62. Then, in step S7, in a case where the comparison result from the memory effect comparison unit 74 indicates that the internal resistance R is smaller than the necessity reference value R2, the process proceeds to Yes in step S7 illustrated in FIG. 8. In step S8, the memory effect determination unit 75 again determines that the memory effect needs to be cancelled, and the process returns to step S1 again. On the other hand, in a case where the comparison result from the memory effect comparison unit 74 indicates that the internal resistance R is not smaller than the necessity reference value R2, the process proceeds to No in step S7 illustrated in FIG. 8. In step S9, the memory effect determination unit 75 determines that the memory effect need not be cancelled, and the process is terminated.

Next, functions and effects of the abnormality determination device 1 for the secondary battery according to the present embodiment will be described in detail.

The present embodiment includes the necessity reference value memory unit 62 storing the necessity reference value R2 used as a reference for determining whether to cancel the memory effect, the memory effect comparison unit 74 comparing the internal resistance R calculated by the internal-resistance calculation unit 71 with the necessity reference value R2 stored in the necessity reference value memory unit 62, the memory effect determination unit 75 determining whether to cancel the memory effect in the secondary battery 2 based on the comparison result from the memory effect comparison unit 74, and the memory effect cancellation unit 81 cancelling the memory effect in the secondary battery 2. In a case where the memory effect determination unit 75 determines that the memory effect needs to be cancelled, the memory effect cancellation unit 81 cancels the memory effect of the secondary battery 2 before the abnormality determination unit 73 determines abnormality. Accordingly, in a case where the memory is present in the secondary battery 2, the memory effect can be cancelled before abnormality in capacity balance is determined, allowing abnormality in capacity balance to be accurately determined.

Further, in the present embodiment, the memory effect determination unit 75 determines that the memory effect in the secondary battery 2 needs to be canceled when the comparison result from the memory effect comparison unit 74 indicates that the internal resistance R calculated by the internal-resistance calculation unit 71 is smaller than the necessity reference value R2 stored in the necessity reference value memory unit 62. This allows accurate detection of whether the memory is present.

Furthermore, in the present embodiment, the memory effect determination unit 75 is configured to determine again whether to cancel the memory effect in the secondary battery 2 after the memory effect cancellation unit 81 cancels the memory effect. Accordingly, for example, in a case where the memory effect in the secondary battery 2 has been insufficiently cancelled, the memory effect is cancelled again to allow abnormality in capacity balance to be accurately determined.

Additionally, in the present embodiment, the memory effect cancellation unit 81 is configured to discharge the secondary battery 2 until the battery voltage of the secondary battery 2 is equal to or lower than a predetermined value to cancel the memory effect. This allows the memory effect of the secondary battery 2 to be reliably cancelled, contributing to an increased accuracy of determination of abnormality in capacity balance.

Figure 9:
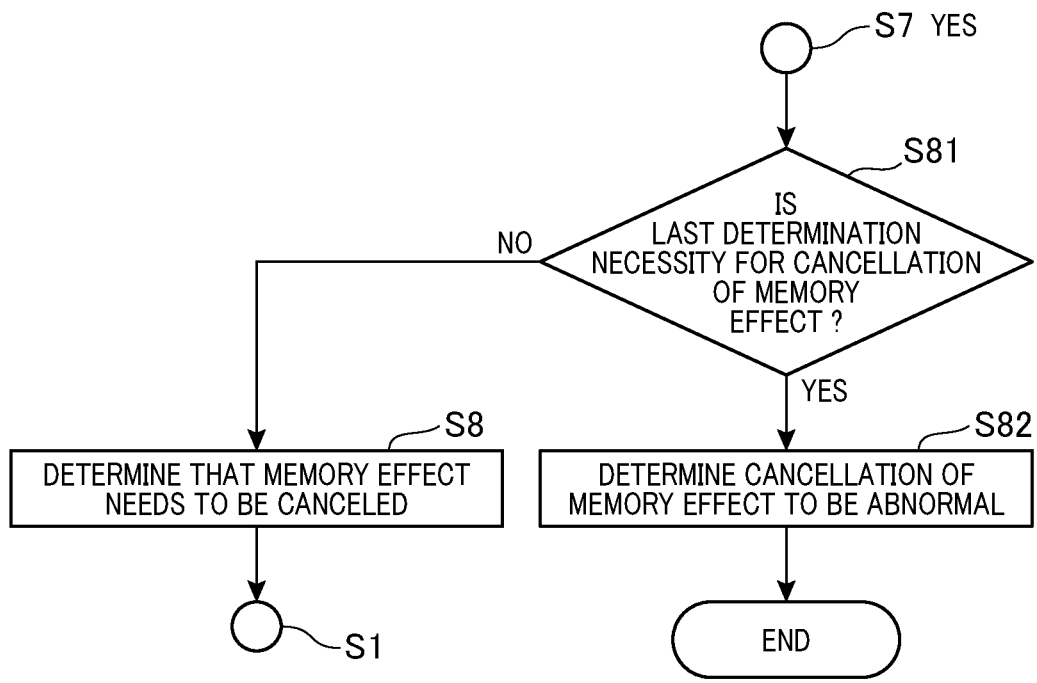
FIG. 9 is a flow chart illustrating a process of estimating abnormality of the secondary battery according to a first modification.

Note that, in the present embodiment, although the process returns to step S1 again in a case where cancellation of the memory effect is determined to be necessary in step S8, alternatively, after the process proceeds to Yes in step S7, the memory effect determination unit 75 determines in step S81 whether the last determination is the necessity for cancellation of the memory effect, as in a first modification illustrated in FIG. 9. In a case where the memory effect determination unit 75 determines that cancellation of the memory effect has been determined to be necessary, the process proceeds to Yes in step S81, and in step S82, the memory effect determination unit 75 determines cancellation of the memory effect in the secondary battery 2 to be abnormal, and ends the control flow. On the other hand, in a case where the memory effect determination unit 75 determines that the last determination is not the necessity for cancellation of the memory effect, the process proceeds to step S8, and returns to step S1 illustrated in FIG. 8. According to the first modification, in a case where the secondary battery 2 is abnormal in cancellation of the memory effect, the control flow can be ended and prevented from being unnecessarily repeated.

Note that, in the first modification, step S81 determines whether the last determination is the necessity for cancellation of the memory effect but that no such limitation is intended and that whether cancellation of the memory effect has been determined to be necessary a predetermined number of times before.

Third Embodiment

Figure 10:
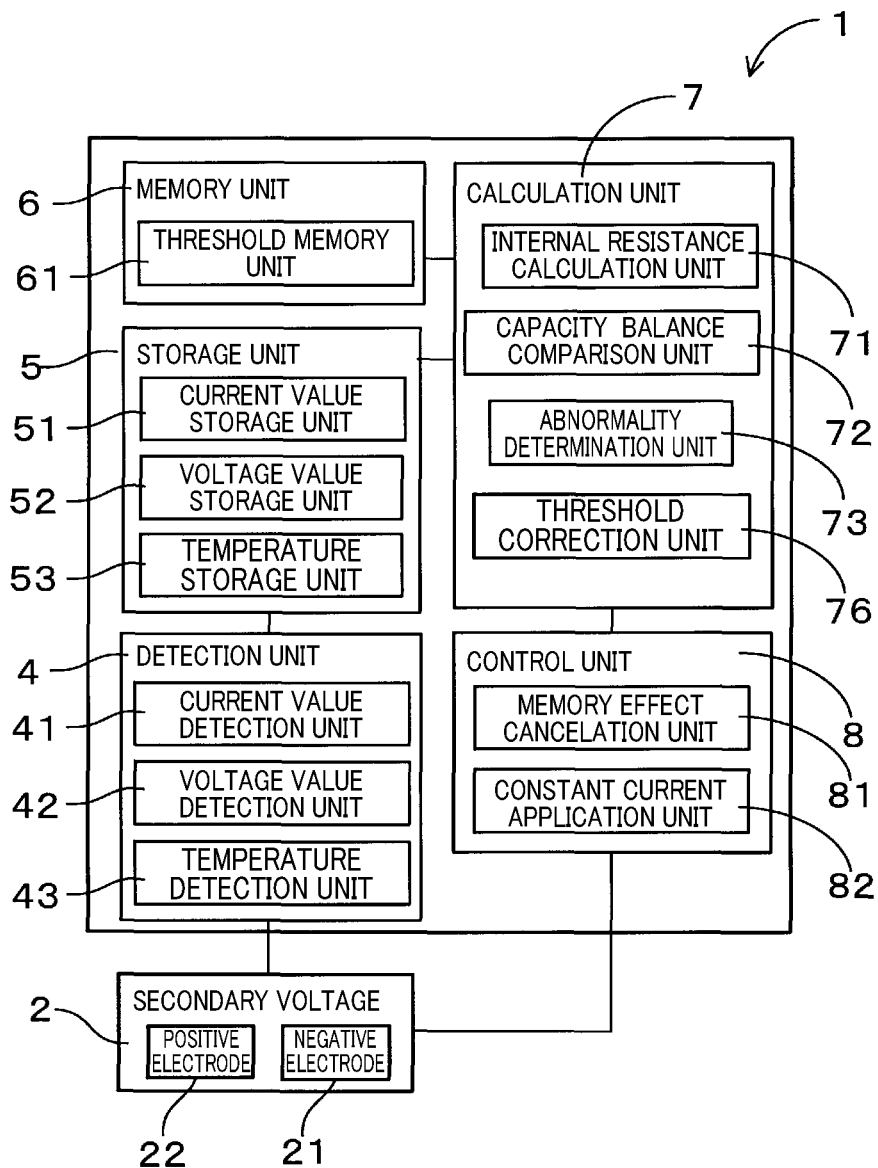
FIG. 10 is a block diagram illustrating a configuration of an abnormality determination device for a secondary battery according to a third embodiment.

An abnormality determination device 1 for the secondary battery according to the present embodiment includes, in addition to the components of the first embodiment illustrated in FIG. 1, a threshold correction unit 76 provided in the calculation unit 7 and correcting the capacity balance threshold stored in the threshold memory unit 61 based on a temperature detected by a temperature detection unit 43, as illustrated in FIG. 10. Additionally, the detection unit 4 includes the temperature detection unit 43 detecting the temperature of the secondary battery 2, and the storage unit 5 includes a temperature storage unit 53 storing the temperature detected by the temperature detection unit 43. The other components of the present embodiment are equivalent to those of the first embodiment, and are denoted by the same reference signs in the first embodiment and will not be described below.

Figure 11:
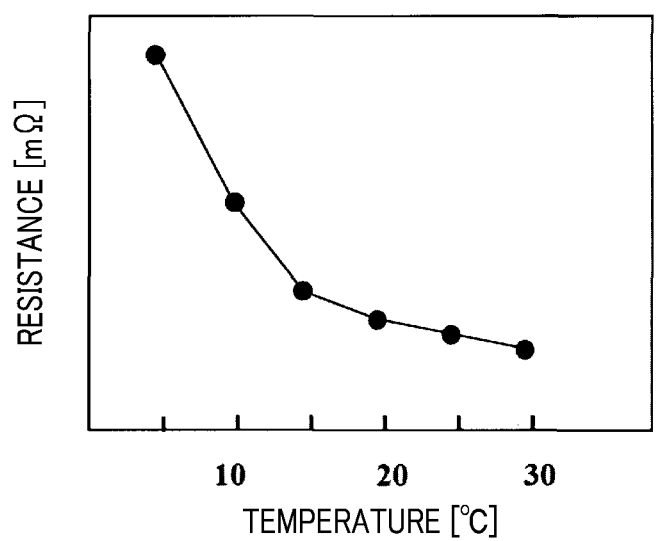
FIG. 11 is a conceptual drawing illustrating a relationship between temperature and a reaction resistance according to the third embodiment.

The threshold correction unit 76 illustrated in FIG. 7 calculates a corrected capacity balance threshold R1' by correcting the capacity balance threshold R1 stored in the threshold memory unit 61 based on the temperature detected by the temperature detection unit 43. For example, the threshold correction unit 76 can acquire a correspondence relationship between the internal resistance R and the temperature in advance, and calculates the corrected capacity balance threshold R1' by correcting, based on the correspondence relationship and the temperature detected by the temperature detection unit 43, the capacity balance threshold R1 stored in the threshold memory unit 61. In the present embodiment, as illustrated in FIG. 11, a correspondence relationship between the reaction resistance and temperature of the negative electrode 21 is acquired and stored in a memory unit not illustrated, in advance, and the threshold correction unit 76 calculates the corrected capacity balance threshold R1' by correcting the capacity balance threshold R1 based on the correspondence relationship and the temperature detected by the temperature detection unit 43.

Figure 12:
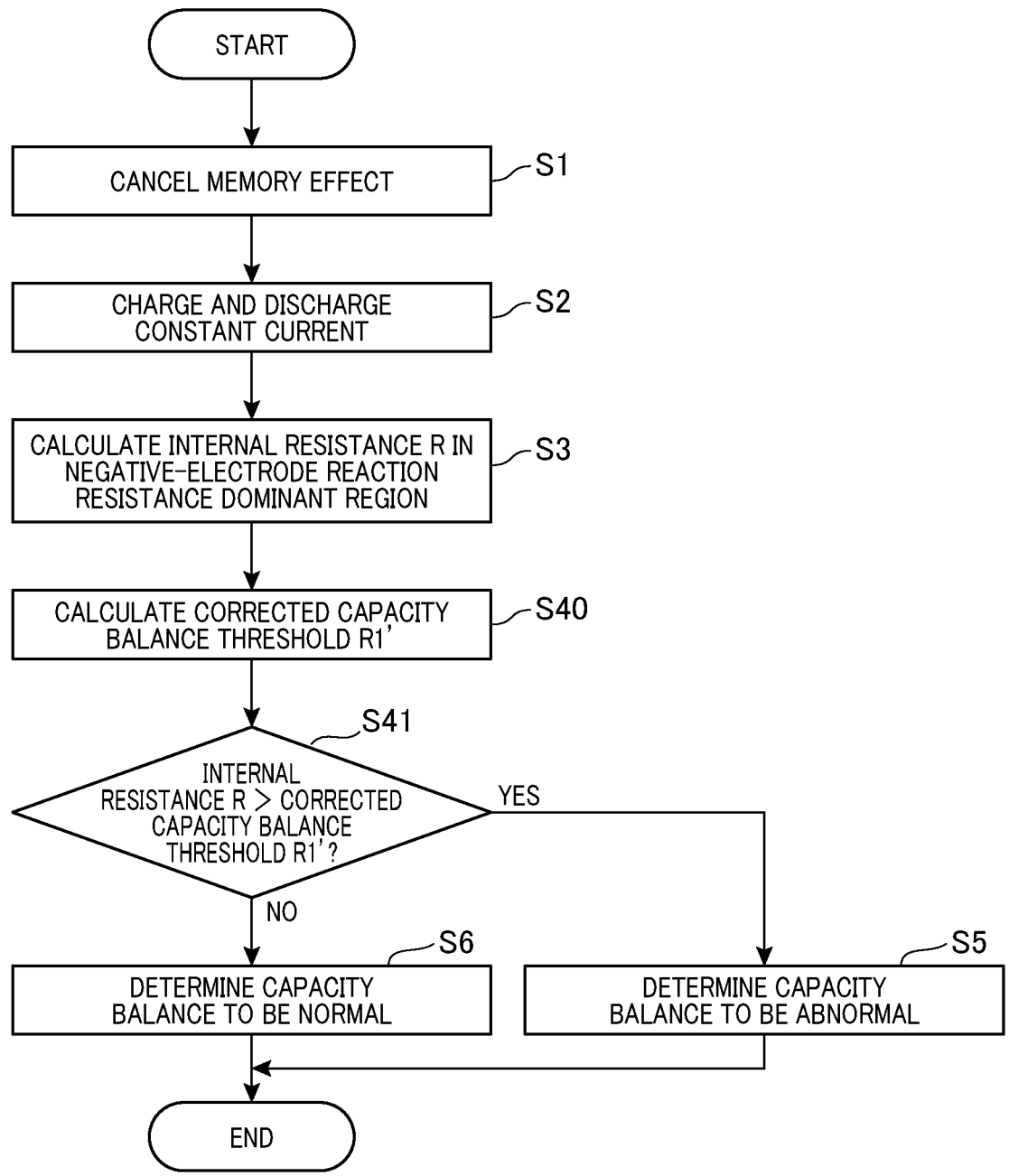
FIG. 12 is a flow chart illustrating a process of estimating abnormality of the secondary battery according to the third embodiment.

Usage of the abnormality determination device 1 according to the present embodiment will be described using a flow chart illustrated in FIG. 12. First, as in the case with the first embodiment illustrated in FIG. 5, steps S1 to S3 are executed. Then, after step S3, as illustrated in FIG. 12, the process proceeds to step S40, and the threshold correction unit 76 calculates the corrected capacity balance threshold R1' by correcting, based on the temperature detected by the temperature detection unit 43, the capacity balance threshold R1 stored in the threshold memory unit 61. The process proceeds to step S41. In step S41, the internal resistance R is compared with the corrected capacity balance threshold R1'.

In a case where the comparison result from the capacity balance comparison unit 72 indicates that the internal resistance R is larger than the corrected capacity balance threshold R1', the process proceeds to Yes in step S41 illustrated in FIG. 12, and in step S5, the abnormality determination unit 73 determines the capacity balance in the secondary battery 2 to be abnormal, and the process is terminated. On the other hand, in a case where the comparison result from the capacity balance comparison unit 72 indicates that the internal resistance R is not larger than the corrected capacity balance threshold R1', the process proceeds to No in step S41. In step S6, the abnormality determination unit 73 determines that the capacity balance in the secondary battery 2 to be normal, and the process is terminated.

The abnormality determination device 1 according to the present embodiment includes the temperature detection unit 43 detecting the temperature of the secondary battery 2, and the threshold correction unit 76 computing the corrected capacity balance threshold R1' by correcting, based on the temperature detected by the temperature detection unit 43, the capacity balance threshold R1 stored in the threshold memory unit 61, and the capacity balance comparison unit 72 compares the corrected capacity balance threshold R1' with the internal resistance R. According to the present embodiment, since the internal resistance R varies depending on temperature, abnormality in capacity balance can be more accurately determined by determining abnormality using the corrected capacity balance threshold R1' resulting from correction based on the temperature of the secondary battery 2. Note that the present embodiment achieves functions and effects equivalent to those of the first embodiment.

The present disclosure is not limited to the above-described embodiments and can be applied to various embodiments without departing from the spirits of the present disclosure. For example, the configuration including the necessity reference value memory unit 62, the memory effect comparison unit 74, and the memory effect determination unit 75 according to the second embodiment may be combined with the configuration including the threshold correction unit 76 according to the third embodiment.

The present disclosure has been described in compliance with the embodiments. However, it is understood that the present disclosure is not limited to the embodiments or structures. The present disclosure includes various modifications and variations within the range of equivalency. In addition, the scope of the present disclosure and the range of concepts of the present disclosure include various combinations or configurations and further include other combinations and configurations corresponding to addition of only one element, two or more elements, or a portion of one element to the above-described various combinations or configurations.

What is claimed is:

1. An abnormality determination device for a secondary battery, the abnormality determination device comprising:
    an internal-resistance calculation unit configured to calculate an internal resistance in a negative-electrode reaction resistance dominant region in which a reaction resistance of a negative electrode is dominant in a charge and discharge reaction of the secondary battery;
    a threshold memory unit that stores a capacity balance threshold used as a reference for determining whether a balance between a capacity of a positive electrode and a capacity of the negative electrode in the secondary battery is abnormal;
    a capacity balance comparison unit configured to compare the internal resistance detected by the internal-resistance calculation unit with the capacity balance threshold stored in the threshold memory unit;
    an abnormality determination unit configured to determine an abnormality in capacity balance in the secondary battery based on a comparison result from the capacity balance comparison unit;
    a constant current application unit configured to apply a pulse current to the secondary battery to charge and discharge the secondary battery;
    a current value detection unit configured to detect a current value in the secondary battery; and
    a voltage value detection unit configured to detect a voltage value in the secondary battery, wherein
    the internal-resistance calculation unit calculates the internal resistance in the negative-electrode reaction resistance dominant region based on the current value detected by the current value detection unit and the voltage value detected by the voltage value detection unit.

2. The abnormality determination device for the secondary battery according to claim 1, wherein
    the abnormality determination unit determines the capacity balance to be abnormal when a comparison result from the capacity balance comparison unit indicates that the internal resistance calculated by the internal-resistance calculation unit is larger than the capacity balance threshold stored in the threshold memory unit.

3. The abnormality determination device for the secondary battery according to claim 1, the abnormality determination device further comprising:
- a necessity reference value memory unit that stores a necessity reference value corresponding to a reference for determining whether to cancel a memory effect;
- a memory effect comparison unit configured to compare the internal resistance calculated by the internal-resistance calculation unit with the necessity reference value stored in the necessity reference value memory unit;
- a memory effect determination unit configured to determine whether to cancel the memory effect in the secondary battery based on a comparison result from the memory effect comparison unit; and
- a memory effect cancellation unit configured to cancel the memory effect in the secondary battery, wherein
- in response to the memory effect determination unit determines that the memory effect needs to be canceled, the memory effect cancellation unit cancels the memory effect in the secondary battery before the abnormality determination unit determines the abnormality.

4. The abnormality determination device for the secondary battery according to claim 3, wherein
the memory effect determination unit determines that the memory effect in the secondary battery needs to be canceled when the comparison result from the memory effect comparison unit indicates that the internal resistance calculated by the internal-resistance calculation unit is smaller than the necessity reference value stored in the necessity reference value memory unit.

5. The abnormality determination device for the secondary battery according to claim 3, wherein
the memory effect determination unit is configured to determine again whether to cancel the memory effect in the secondary battery after the memory effect cancellation unit cancels the memory effect.

6. The abnormality determination device for the secondary battery according to claim 3, wherein
the memory effect cancellation unit is configured to discharge the secondary battery to cancel the memory effect until a battery voltage of the secondary battery is equal to or lower than a predetermined value.

7. The abnormality determination device for the secondary battery according to claim 1, the abnormality determination device further comprising:
- a temperature detection unit is configured to detect a temperature of the secondary battery; and
- a threshold correction unit is configured to calculate a corrected capacity balance threshold by correcting the capacity balance threshold stored in the threshold memory unit based on the temperature detected by the temperature detection unit, wherein
the capacity balance comparison unit compares the internal resistance with the corrected capacity balance threshold.

* * * * *